(12) United States Patent
Vom Stein

(10) Patent No.: US 11,754,627 B2
(45) Date of Patent: Sep. 12, 2023

(54) DEVICE AND METHOD FOR PURPOSES OF ELECTRICAL CIRCUIT MONITORING

(71) Applicant: Turck Holding GmbH, Halver (DE)

(72) Inventor: Johannes Vom Stein, Hückeswagen (DE)

(73) Assignee: Turck Holding GmbH, Halver (DE)

( * ) Notice: Subject to any disclaimer, the term of this patent is extended or adjusted under 35 U.S.C. 154(b) by 134 days.

(21) Appl. No.: 16/900,296

(22) Filed: Jun. 12, 2020

(65) Prior Publication Data

US 2020/0393512 A1 Dec. 17, 2020

(30) Foreign Application Priority Data

Jun. 13, 2019 (DE) .......................... 102019116147.9
May 22, 2020 (DE) .......................... 102020113822.9

(51) Int. Cl.
*G01R 31/327* (2006.01)

(52) U.S. Cl.
CPC ................................. *G01R 31/3275* (2013.01)

(58) Field of Classification Search
None
See application file for complete search history.

(56) References Cited

U.S. PATENT DOCUMENTS

| 2010/0096930 A1* | 4/2010 | Kuhl ......................... G05F 1/46 307/80 |
| 2011/0133574 A1* | 6/2011 | Nitsche ................ H01H 47/005 307/326 |
| 2012/0161817 A1* | 6/2012 | Kanayama ........... G01R 31/006 327/108 |

FOREIGN PATENT DOCUMENTS

| DE | 102006040737 A1 | 3/2008 |
| DE | 102010004524 A1 | 7/2011 |
| EP | 1630564 A1 | 3/2006 |

* cited by examiner

*Primary Examiner* — Nasima Monsur
(74) *Attorney, Agent, or Firm* — WHITMYER IP GROUP LLC

(57) ABSTRACT

Method and device for monitoring an electrical load connected to a power supply, with first and second current paths, each having an actuating element, the current transmission capacity of which is alterable by an actuating signal, wherein the operating state of each actuating element is characterized by a voltage drop and the actuating signal. An open-loop control device is configured to activate the actuating elements, at least at measuring intervals spaced apart from one another in time, and evaluate values of the electrical variables obtained for detecting a malfunction of the actuating element, wherein one of the two variables is held at a prescribed value, and the values of the other variable are correlated with one another. A field-effect transistor is activated such that the transistor is not connected through, but rather that a greater voltage drops across the transistor than would be the case in the connected through state.

15 Claims, 3 Drawing Sheets

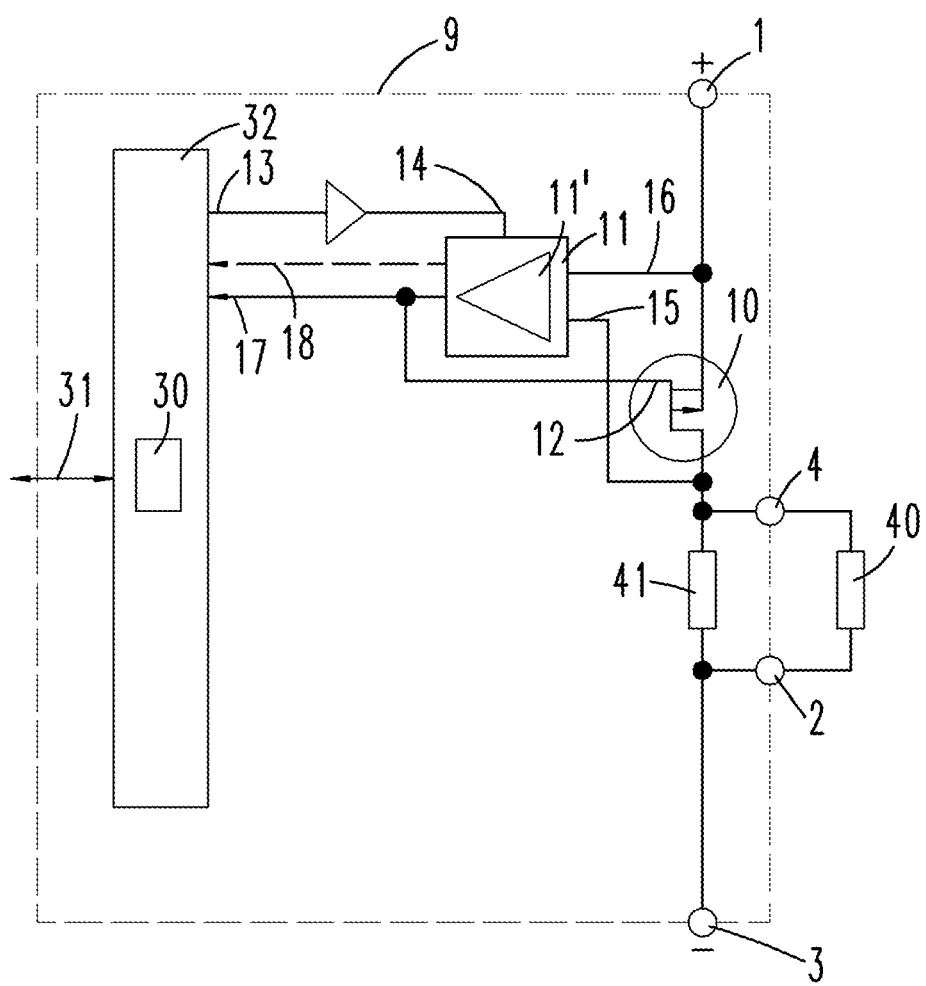

DEVICE AND METHOD FOR PURPOSES OF ELECTRICAL CIRCUIT MONITORING

TECHNICAL FIELD

The invention concerns a device for purposes of monitoring an electrical load connected to a power supply, with a first and a second current path, wherein at least one electrical actuating element is provided in the first and/or in the second current path, the current transmission capacity (conductivity/resistance) of which actuating element can be altered by means of an actuating signal, wherein the operating state of the actuating element is characterized by two electrical variables, of which one is a voltage drop measured by a voltage-measuring device, and the other is the actuating signal, and with an open-loop control device, which is configured so as to actuate the respectively one actuating element, at least at measuring intervals spaced apart in time, and so as to evaluate values of the electrical variables obtained in this process for purposes of detecting a malfunction of the actuating element, wherein one of the two variables is held at a prescribed value.

BACKGROUND

Actuating elements or other electrical loads deployed in functionally safe systems must always be capable of being switched off. This is particularly necessary if there is a risk of a situation that is dangerous for people. In order to achieve a high level of functional safety, a plurality of switching elements are necessary, of which one functioning element is sufficient to switch off the electrical load.

DE 10 2010 004 524 A1 provides a generic device for purposes of electrical circuit monitoring. An electrical load relates to two current paths, in each case to one supply terminal. In each of these two current paths there is located a switch-off device, wherein the two switch-off devices are designed as mirror images of one another. The current path can be interrupted with an actuating element designed in the form of a field-effect transistor. In the conductive state, the field-effect transistor is connected through by means of an appropriate actuating signal. A voltage-measuring device is used to measure the voltage drop between source and drain on the field-effect transistor. At high currents and a sufficiently high voltage drop on the field-effect transistor, which has an ohmic character during operation, the current in the two current paths can be determined. Any crosscurrents can be determined by forming the difference between the two measured voltage drops, or currents calculated from the latter. The actuating element is briefly actuated at time intervals such that it switches off. From the voltage then measured at the actuating element, a conclusion can be drawn on the functionality, in particular the disconnection capability, of the field-effect transistor.

As a result of the brief disconnection, carried out at time intervals, unwanted voltage/current pulses are generated, which can lead to malfunctions.

DE 10 2006 040 737 A1 describes a device for shunt detection on a valve stage. A test path with a measuring resistor is connected in parallel with a switch, from which resistor a voltage can be tapped.

EP 1 630 564 A1 describes a measuring circuit for purposes of measuring a source-drain voltage on a field-effect transistor, wherein temperature influences are compensated for by means of a compensation circuit.

US 2012/0161817 A1 describes a circuit to supply a coil of a relay with electrical power. The power required for this task is provided by a battery. Two supply lines running in parallel with one another are provided, in each of which a field-effect transistor is provided as a switch. For the energization of the coil, the gate voltages of the field-effect transistors are synchronously brought to a value at which current flows through both field-effect transistors. At regular intervals the gate voltage is lowered slightly, and the voltage drop between drain and source is measured. The measured values are evaluated for a possible wire break in the supply line to the field-effect transistor.

SUMMARY

The object underlying the invention is that of improving the testing of the functionality of the actuating element in a generic device, and in a generic method.

The object is achieved by the invention specified in the claims, wherein the dependent claims not only represent advantageous further developments of the subsidiary claims, but also independent solutions of the object.

In accordance with a first aspect of the invention, a regulating circuit is proposed. The open-loop control device supplies a prescribed value as a reference variable, for example a reference voltage. A regulator supplies a controlling variable, which acts on the closed-loop control system formed by the actuating element. The regulating variable is the voltage drop on the actuating element, which is fed back to the regulator. Largely independent of the power consumed by the load, the voltage is regulated against the prescribed setpoint value. In that the open-loop control device observes the regulating behavior of the regulator, and the response of the actuating element to the controlling variable, any malfunction of the actuating element can be detected.

In accordance with a second aspect of the invention, it is proposed that, at least within one measuring interval, the actuating elements are not operated at their maximum current transmission capacity, which is comparable to a conductance, but rather in a range in which their resistance is greater than the minimum resistance that would be possible if the same current were passed through. This can be executed with a fixedly prescribed actuating signal. However, provision is also made for the actuating signal to be the controlling variable of a regulating circuit. If, for example, the actuating element takes the form of a transistor, the transistor, at least during the measuring interval, is not operated in a full power mode, but is activated such that a sufficiently large voltage drop occurs at the actuating element, with which even small currents can be determined. A sufficiently low current flows through the base of a bipolar transistor used as an actuating element, or a sufficiently low voltage is applied to the gate of a field-effect transistor, such that the voltage drop on the actuating element (transistor, emitter-collector path, or source-drain path) is, for example, at least 100 mV. In the course of the measurement, either the actuating signal is held at a fixed value at which there is a correspondingly high voltage drop on the actuating element, or a closed-loop control is used, with which the actuating signal is adjusted such that a prescribed voltage drop occurs on the actuating element. Based on the known characteristic curve of the actuating element, the current can be determined from the measured voltage drop for a prescribed value of the actuating signal, or the current can be calculated from the measured value of the actuating signal. The measured values thus calculated in the two current paths can be compared with one another. A variant of the invention and examples of embodiment relating to the latter provide for the voltage-measuring device in each case being part of an open-loop or closed-loop control device, which in each case provides the actuating signal, wherein the actuating signal is obtained from the voltage drop on the actuating element as measured by the voltage-measuring device. The actuating element can be a switch, a semiconductor switch, a transistor and in particular a field-effect transistor, wherein the field-effect transistor can have both an n-channel and also a p-channel. In particular, provision is made for the values evaluated by the open-loop control device to be the actuating signals provided by the closed-loop control device. These are preferably actuating signals of the type with which the voltage drop is regulated against a reference voltage. The reference voltage is a setpoint voltage prescribed by the open-loop control device, which can also be current dependent. In order to keep the power level on the actuating element within the permissible range, a low reference voltage is prescribed for high currents. For low currents, however, a higher reference voltage can be prescribed. The voltage-measuring device can have an operational amplifier, one input of which is connected to the source of a field-effect transistor forming the actuating element, and another input of which is connected to the drain. The output signal of the operational amplifier is used for closed-loop control purposes in order to supply a gate voltage as a controlling variable, with which the voltage drop on the field-effect transistor is regulated against the setpoint value formed by the reference value. In a simplest variant of the invention, field-effect transistors of the same type are used, which thus have the same characteristic curve. The open-loop control device can then directly correlate the actuating signals used for closed-loop control purposes, in particular the gate voltages, so as to check whether a malfunction has occurred. If the absolute value of the difference between the two actuating signals is less than a threshold value, the same currents flow through both transistors, so that no crosscurrents flow. If the resistance of the field-effect transistor, or its conductance, can be altered by varying the gate voltage, this is a sign that the field-effect transistor has no short circuit and is functional. However, it is also possible to use field-effect transistors of different types, for example one field-effect transistor can be a p-channel field-effect transistor, and the other field-effect transistor an n-channel field-effect transistor. The two transistors then possess differing characteristic curves. Provision can then be made for the open-loop control device to compare the gate voltage value used to regulate the voltage drop against a prescribed value, or from this voltage value to construct a standard value using a characteristic curve stored in the open-loop control device. Two standard values formed in this way, each from one of the actuating elements, can then be directly correlated with one another, for example by forming a difference and comparing the difference with a threshold value. If the difference is smaller than the threshold value, the monitoring circuit is considered to be functional. If the difference value is greater than the threshold value, a malfunction is detected. In a further development provision is made for the open-loop control device to have a measuring input, to which the current value of the gate voltage is applied. A further measuring input of the open-loop control device can be provided, to which the voltage drops on the actuating element, as measured by the voltage-measuring device, is applied. The closed-loop control device can also have a control input, into which an actuating signal provided by a control channel of the open-loop control device can be input, so as, for example, to prescribe the reference voltage, or to connect through the transistor forming the actuating element. Instead of the field-effect transistor mentioned above, other electronic, regulable actuating elements, such as bipolar transistors, or valves, can also be used. The above explanatory notes then apply accordingly for these electronic switching elements. In particular, it is intended that the actuating elements are activated at measuring intervals spaced apart from one another in time. However, provision is also made for the actuating elements to be continuously activated, and, in particular, for continuous measurements to be undertaken. Provision is not only made to vary the conductance of the actuating elements and, in particular, to reduce it from a maximum value. Provision is also made, and is relevant to safety, to block the actuating elements completely. Furthermore, provision can be made for the essential components of the device to be grouped together in an integrated circuit. In particular, the transistors and the elements for their regulation are integrated in one component.

In a further development of the invention provision is made for the voltage drop to be not only measured at the actuating element, but for the voltage drop on the load to also be included in the measuring path.

In one aspect of the invention, which has an independent character, provision is made that, in contrast to the prior art, the conductance of the actuating element is not switched between maximum conductivity and maximum insulation, but rather that for purposes of detecting the malfunction, the conductance of the actuating element is merely reduced from a maximum value, wherein the conductance is reduced only to such an extent that a current sufficient for the function of the actuating element flows through the load, and on the actuating element itself a decreased power level does not destroy the latter. In order to be able to set this power level as high as possible, in accordance with the invention provision can also be made for the semiconductor switch used to be oversized. By a suitable selection of the reference voltage, the power level can be held within the permissible range. In one variant of the invention, provision can be made for the actuating signals, for example the gate voltages, to be set at a prescribed value. This value is selected such that there is a sufficient voltage drop on the actuating elements, that is to say, in particular on the transistors, for purposes of current measurement. The voltage drops on the transistors can then be compared with one another. This is also done by correlation, wherein a correction can also be applied here by means of a characteristic curve. Provision can also be made here that it is not the voltage drop directly on the transistors that is measured, but rather that the voltage is tapped across the load and the transistors, such that the measured voltage is the sum of the voltage drop on the load and the voltage drop on the transistor.

BRIEF DESCRIPTION OF THE DRAWINGS

In what follows an example of embodiment of the invention is explained with the aid of the accompanying figures. Here:

FIG. 5 shows a circuit diagram of a second example of embodiment.

DETAILED DESCRIPTION

Figure 1:
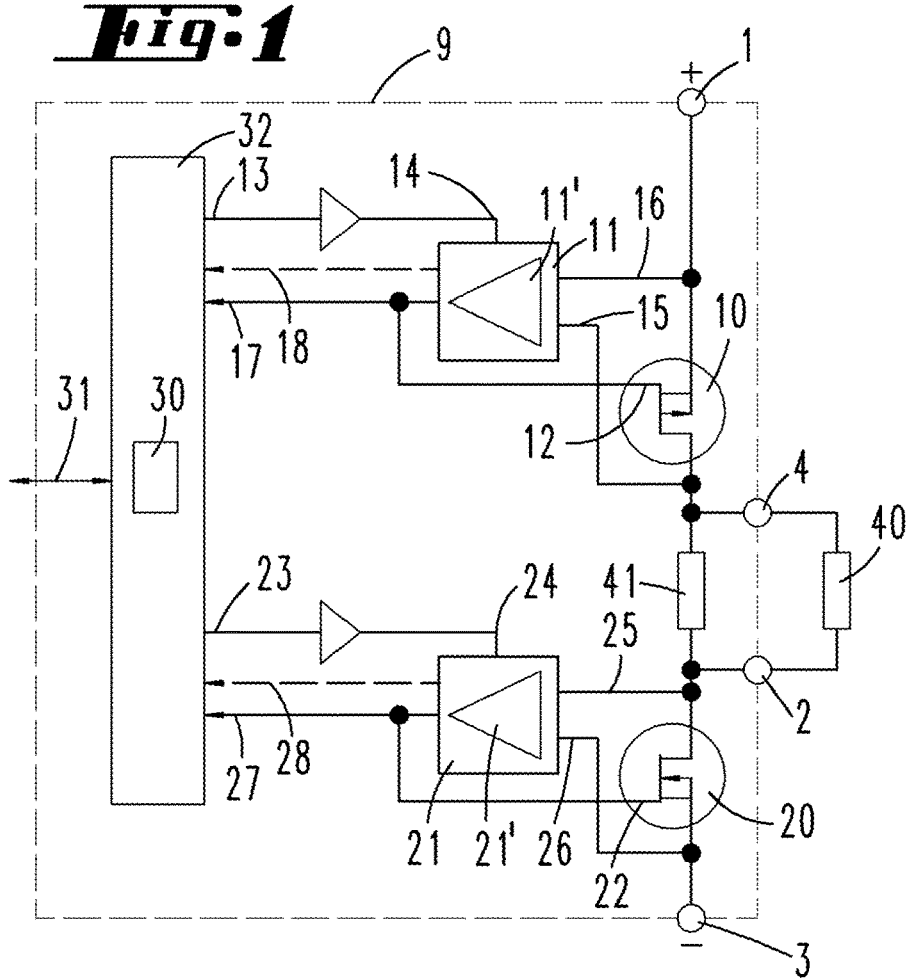
FIG. 1 shows a circuit diagram of a first example of embodiment.

FIG. 1 shows an electrical device 9 for purposes of testing the disconnectability of two supply voltage terminals 1, 3, which are connected to two load terminals 4, 2, in each case via a semiconductor switch 10, 20. The semiconductor switches 10, 20 are in each case located in a regulating circuit. The semiconductor switches 10, 20 form the closed-loop control system, wherein the regulating variable is the voltage drop on the two poles of the semiconductor switches 10, 20. The voltage is tapped off from the inputs 15, 16 of an operational amplifier, which is part of a voltage-measuring device 11', 21'. At a control input 14, 24 a closed-loop control device 11, 21, which contains the voltage-measuring device 11', 21', obtains a reference voltage.

The closed-loop control device 11, 21 supplies a controlling variable 12, 22, which influences the resistance via the conductivity of the actuating element 10, 20.

In the example of embodiment, the actuating elements 10, 20 are in each case field-effect transistors. One of the two field-effect transistors can be a p-channel field-effect transistor. The other field-effect transistor can be an n-channel field-effect transistor. However, they can also both be n-channel or p-channel field-effect transistors. In this case the regulating variable is the source-drain voltage drop $U_{SD}$ on the field-effect transistors 10, 20. The controlling variable in this case is the gate voltage $U_{GS}$.

The open-loop control device 32 can have a microcontroller 30, and can be connected to other peripheral devices via an external communications line 31.

The open-loop control device 32 possesses inputs 17, 27, to which the actuating signal, that is to say, the gate voltage $U_{GS}$, is applied. Inputs 18, 28 are also provided, to which the source-drain voltage $U_{SD}$ is applied.

The circuit is preferably designed to be completely symmetrical with regard to the actuating elements 10, 20 and the closed-loop control devices 11, 21. A parallel resistor 41 can be arranged between the two load terminals 2, 4, which resistor is connected in parallel with the electrical load 40.

The control input 14, 24 can not only be used to prescribe a reference voltage. It is also possible to completely connect through the actuating elements 10, 20 via the control inputs 14, 24 and the corresponding control lines 13, 23, such that they assume their minimum resistance, that is to say, their maximum conductance.

The open-loop control device 32 is configured to correlate the measured values at the measuring inputs 17, 27 with one another. In the simplest case, this can be done by forming an absolute value of a difference between the two measured values, and comparing this with a threshold value. This can be done both digitally and analogously. This direct comparison is particularly possible if transistors of the same type are used as the actuating elements 10, 20. If different types of transistors are used as the actuating elements 10, 20, it may be necessary to modify the measured values located at the measuring inputs 17, 27, that is to say, in particular, the gate voltages $U_{GS}$, by, for example, applying correction values, wherein these correction values can be taken from a prescribed characteristic curve. The raw signals supplied by the regulator 11, 21 are thus used to form comparable, in particular normalized, signals (standard signals), which can be correlated with one another.

Figure 2:
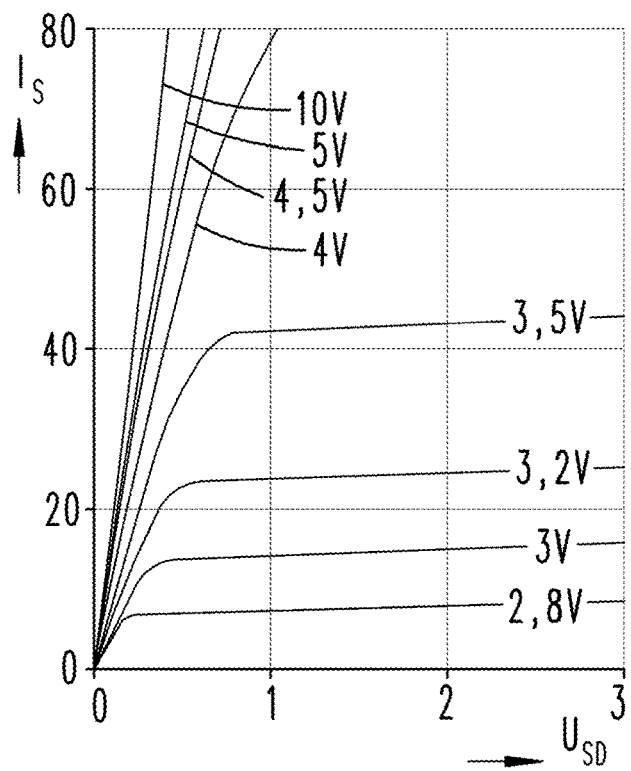
FIG. 2 shows a typical set of characteristic curves of a field-effect transistor.

FIG. 2 shows a set of characteristic curves for a typical field-effect transistor, wherein each characteristic curve corresponds to a particular gate voltage $U_{GS}$. It can be seen that the source-drain current $I_{SD}$ has an influence on the source-drain voltage $U_{SD}$ if the gate voltage $U_{GS}$ is held constant, or that with varying currents the gate voltage $U_{GS}$ must be altered in order to maintain the source-drain voltage $U_{SD}$ at a prescribed value. If the field-effect transistor is operated at full power, which is the case, for example, with a gate voltage $U_{GS}$ of 10 volts, the circuit operates in the linear range. In this operating mode the lowest voltage drop occurs on the field-effect transistor. At high currents, sufficiently high source-drain voltages $U_{SD}$ can be measured with such a field-effect transistor operated at full power, which voltages can be compared with one another so as to be able to exclude crosscurrents in the load 40.

At low currents, such as 200 mA, the source-drain voltage $U_{SD}$ is only 1 mA for the fully through-connected field-effect transistor, which makes accurate measurement difficult.

It is therefore proposed, for the measurement of any crosscurrents, either continuously or at time intervals, by means of a suitable gate current $U_{GS}$, to increase the source-drain voltage $U_{SD}$ to a prescribed value, for example to 0.5 V, at which a measurement for crosscurrents is possible. In this case, it is not the source-drain voltages $U_{SD}$ of the actuating elements 10, 20 of the two current paths that are compared with one another, but rather the gate voltages $U_{GS}$, which are required in order to set the desired source-drain voltages $U_{SD}$. The gate voltage $U_{GS}$ is preferably provided with the closed-loop control device described above.

With the last-described measuring method, it is not only any possible crosscurrents that can be detected. It is also possible to check the functionality of the field-effect transistor. A short-circuited (broken down) field-effect transistor would not show an increased voltage drop over the source-drain path, if a correspondingly high gate voltage $U_{GS}$ were to be applied to its gate.

Figure 3:
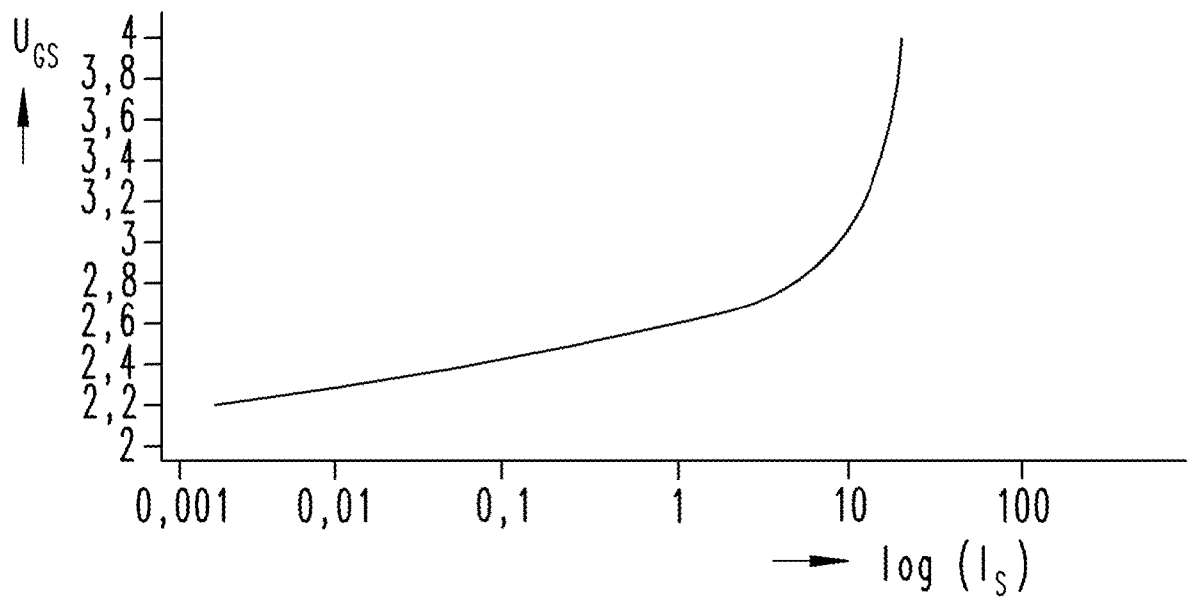
FIG. 3 shows a diagram plotting the gate voltage $U_{GS}$ against the logarithm of the current flowing through the source-drain path under ideal conditions.

FIG. 3 shows the gate voltage $U_{GS}$ at a prescribed source-drain voltage $U_{SD}$ to achieve a certain source-drain current $I_{SD}$ in the ideal case in which field-effect transistors are used, which have the identical characteristic curve.

Figure 4:
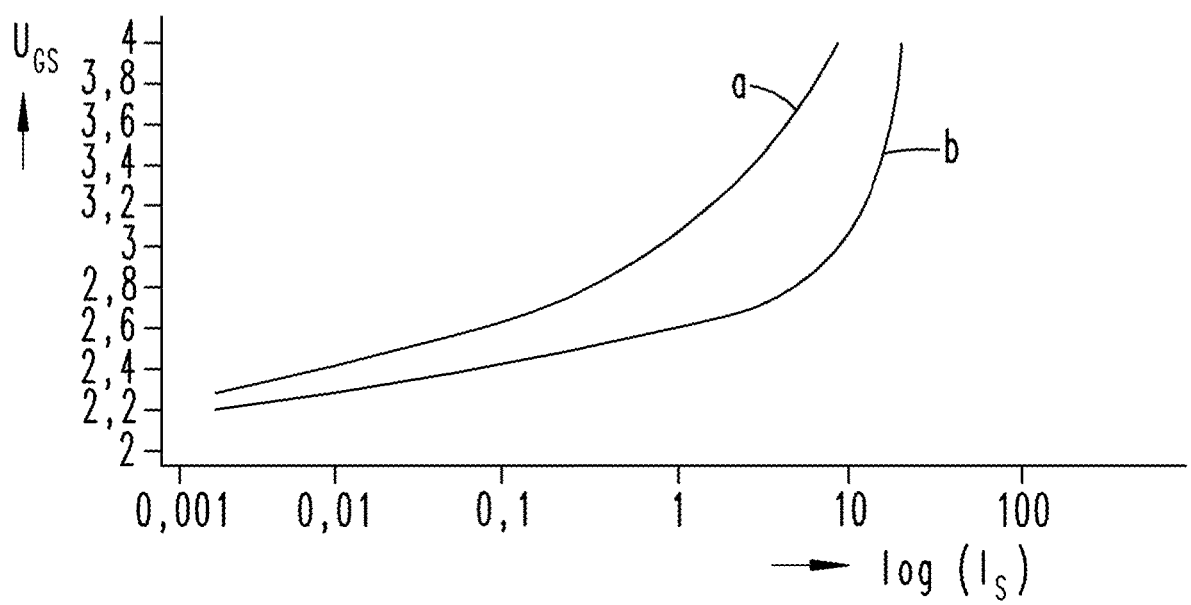
FIG. 4 shows a plot as in FIG. 3 where the conditions are deviating from the ideal conditions.

FIG. 4 shows the influence of the gate voltage $U_{GS}$, which is required to achieve the same source-drain voltage $U_{SD}$ with two different field-effect transistors a, b at different currents $I_{SD}$. It can be seen that the two curves differ from one another. In order to be able to compare the gate voltages $U_{GS}$ of the two transistors 10, 20 under these conditions, correction values must be applied to the gate voltages $U_{GS}$ that are being compared. This is done in the open-loop control device 32, either numerically or analogously, for example via a resistor network.

With the circuit shown in FIG. 1, it is not only possible to test the functioning of the field-effect transistors periodically without switching off the load 40 for a short time, but also to examine the load 40 for possible crosscurrents, even at low currents. The device can also be used in the manner in which the prior art tests the disconnection capability, namely by briefly making the actuating elements 10, 20 very high-impedance at time intervals, for example by activating them with a gate voltage $U_{GS}$ of zero. For this purpose, appropriate control signals can be sent to the regulators 11, 21 via the control inputs 14, 24, or any other control input (not shown).

In a variant of the invention, which is not shown in the figures, the voltage drops directly on the actuating elements 10, 20 are not applied to the inputs 15, 16 or 25, 26, but rather the sum of the voltage drop on the actuating element 10 and the load 40, or the voltage drop on the actuating element 20 and the load 40, is applied to a pair of inputs 15, 16, 25, 26 respectively. For this purpose the input 25 is connected to the load terminal 4, and the input 15 is connected to the load terminal 2, so that the voltage drops on the resistors 40, 41 are added to the voltage drops on the actuating elements 10, 20 respectively.

FIG. 5 shows a second example of embodiment. The circuit shown there essentially corresponds to the upper branch of the circuit shown in FIG. 1. The supply voltage terminal 3 is directly connected to the load terminal 2. In this example of embodiment, only one actuating element 10 is provided, which is arranged between the supply voltage terminal 1 and the load terminal 4 in the upper current path. The open-loop control device 30, which here also can be designed as a microregulator, supplies a setpoint value of a voltage, against which the voltage measured at the inputs 15 and 16 of the closed-loop control device 11 between the drain and source of the field-effect transistor forming the actuating element 10 is regulated. The gate voltage supplied by the closed-loop control device 11 is applied to the measuring input 17 of the open-loop control device 30. This is observed by the open-loop control device 30 and examined for correct or faulty behavior.

The open-loop control device 30 thus supplies a reference variable in the form of a reference voltage, which the regulator 11 compares with a fed-back regulating variable. In the present case, the regulating variable is the voltage drop on the actuating element 10. In terms of control technology the actuating element 10 forms the closed-loop control system. The disturbance variable is the current flowing through the actuating element, which depends on the power consumption of the load 40. The disturbance variable influences the voltage drop on the actuating element 10. The regulator 11 supplies a controlling variable in the form of the gate-source voltage 12.

The above statements serve to explain the inventions recorded by the application as a whole, which further develop the prior art, at least by means of the following combinations of features, and in each case also independently, wherein two, a plurality, or all of these combinations of features can also be combined, namely:

A device, characterized by a first closed-loop control device 11, with which voltage drop $U_{SD}$ is regulated to the prescribed value.

A method, which is characterized in that the voltage drop $U_{SD}$ is regulated to the prescribed value.

A device, which is characterized in that the two actuating elements 10, 20 are controlled in the measuring interval such that the voltage drop $U_{SD}$ is greater than the minimum possible at the same current.

A device or a method, which is characterized in that the voltage drop $U_{SD}$ on the first actuating element 10, and on the second actuating element 20, is in each case regulated to a prescribed value by means of a closed-loop control device 11, 21.

A device or a method, which is characterized in that the actuating signals 12, 22 generated during the regulation are correlated with one another.

A device or a method, which is characterized in that each actuating element 10, 20 is assigned a closed-loop control device 11, 21, which interacts with the voltage-measuring device 11', 21' so as to regulate the respective voltage drop $U_{SD}$ against a reference voltage.

A device or a method, which is characterized in that the values of the respective other variables are compared directly, or that standard signals are generated by an application of correction values, which are correlated with one another or with prescribed values by the open-loop control device 30.

A device or a method, which is characterized in that the actuating element 10, 20 is a transistor, and the actuating signal is a control current or a control voltage $U_{GS}$, wherein in particular provision is made for the transistor to be an n-channel or a p-channel field-effect transistor, and for the actuating signal 12, 22 to be the gate voltage $U_{GS}$, wherein the voltage drop $U_{SD}$ is measured between source and drain of the field-effect transistor.

A device or a method, which is characterized in that the open-loop control device 30 is configured so as to form a difference between the first and second actuating signals 12, 22, or between standard signals obtained from the latter, and to compare this difference with a threshold value.

A device or a method, which is characterized in that the closed-loop control device 11, 21 has a control input 14, 24 for purposes of prescribing the reference voltage, and/or for purposes of switching through the actuating element 10, 20.

A device or a method, which is characterized in that, for purposes of detecting the malfunction, the conductance of the actuating element 10, 20 is reduced, starting from a maximum value, to such an extent that a current sufficient for its function flows through the load 40, and is only reduced to such an extent that a power level that does not destroy the actuating element 10, 20 is delivered to the latter.

A device or a method, which is characterized in that the actuating signals 12, 22 are set to a prescribed value, and the voltage drops $U_{SD}$ on the two actuating elements 10, 20 are compared, or in that the voltage drops $U_{SD}$ on the two actuating elements 10, 20 are regulated to a prescribed value, and the actuating signals 12, 22 required for this purpose are compared with one another.

All disclosed features are essential to the invention (both individually, and in combination with one another). In the disclosure of the application, the disclosure content of the associated/attached priority documents (copy of the prior application) is hereby also incorporated in full, also for the purpose of incorporating features of these documents in the claims of the present application. The subsidiary claims characterize, even without the features of a claimed claim, with their features independent inventive developments of the prior art, in particular in order to make divisional applications on the basis of these claims. The invention prescribed in each claim can additionally comprise one or a plurality of the features described in the above description, in particular with features provided with reference symbols and/or prescribed in the list of reference symbols. The invention also relates to forms in which individual of the features mentioned in the above description are not implemented, in particular insofar as they are recognizably dispensable for the respective purpose, or can be replaced by other technically equivalent means.

The invention claimed is:

1. A device for purposes of monitoring the disconnectability of an electrical load, which is connected to a power supply with a first and a second current path, the device comprising:

a first electrical actuating element that is provided in the first or second current path, the first electrical actuating element having two terminals and a current transmission capacity (conductivity/resistance) which is alterable by means of a first actuating signal, wherein an operating state of the first electrical actuating element is characterized by a first electrical variable and a second electrical variable, the first electrical variable being a voltage drop the first electrical actuating element and the second electrical variable being the first actuating signal, a first voltage-measuring device connected directly to the two terminals of the first electrical actuating element and being configured to measure the voltage drop across the two terminals of the first electrical actuating element, and an open-loop control device, which is configured so as to activate the first electrical actuating element, at least at measuring intervals spaced apart from one another in time, and so as to evaluate values of the electrical variables thereby obtained for purposes of detecting a malfunction of the first electrical actuating element, wherein one of the two electrical variables is held at a prescribed value, wherein the device further comprises a first closed-loop control device configured to regulate the voltage drop across the first electrical actuating element at the prescribed value.

2. The device of claim 1, wherein:

the device further comprises a second electrical actuating element that is provided in the first or second current path, the second electrical actuating element being connected in series with the first electrical actuating element and having a current transmission capacity (conductivity/resistance) which is alterable by means of a second actuating signal, an operating state of the second electrical actuating element is characterized by a first electrical variable, which is a voltage drop on the second electrical actuating element, and a second electrical variable, which is the second actuating signal, the device further comprises a second voltage measuring device configured to measure the voltage drop on the second electrical actuating element, the open-loop control device is configured such that the first and second actuating elements are actuated at least in the measuring intervals, spaced apart from one another in time, and values of the electrical variables thereby obtained are evaluated for purposes of detecting a malfunction of the first or second electrical actuating element, and the first and second electrical actuating elements are controlled in the measuring intervals such that the respective voltage drop is greater than a minimum possible at the same current.

3. The device as claimed in claim 2, wherein, the voltage drop on the first electrical actuating element and the voltage drop on the second electrical actuating element are in each case regulated to a prescribed value by means of the first closed-loop control device and a second closed-loop control device respectively.

4. The device as claimed in claim 3, wherein, the actuating signals generated during the regulation are correlated with one another.

5. The device as claimed in claim 2, wherein, each actuating element is assigned a closed-loop control device, interacting with the voltage-measuring device, so as to regulate the respective voltage drop against a reference voltage.

6. The device as claimed in claim 1, wherein the first electrical actuating element is a transistor, and the first actuating signal is a control current or a control voltage, wherein the transistor is an n-channel or a p-channel field-effect transistor, and the first actuating signal is the gate voltage, and wherein the voltage drop is measured between source and drain of the field-effect transistor.

7. The device as claimed in claim 2, wherein, the open-loop control device is configured to form a difference between the first and second actuating signals, or between standard signals obtained therefrom, and to compare the difference with a threshold value.

8. The device as claimed in claim 1, wherein, the first closed-loop control device has a control input for prescribing a reference voltage, and/or for connecting through the first electrical actuating element.

9. The device of claim 2, wherein, in order to detect the malfunction, the conductance of the first electrical actuating element is reduced, starting from a maximum value, to such an extent that a current sufficient for its function flows through the electrical load, and is only reduced to such an extent that a power level that does not destroy the first electrical actuating element is delivered to the first electrical actuating element.

10. The device as claimed in claim 9, wherein, the first and second actuating signals are set to a prescribed value, and the voltage drops on the two actuating elements are compared, or wherein the voltage drops on the two actuating elements are regulated to a prescribed value, and the first and second actuating signals required for this purpose are compared with one another.

11. The device of claim 1, wherein the voltage drop is regulated at the prescribed value by modifying the second electrical variable.

12. A method for purposes of monitoring the disconnectability of an electrical load, which is connected to a power supply with a first and a second current path, the method comprising:

using a device which includes:

a first electrical actuating element that is provided in the first or second current path, the first electrical actuating element having two terminals and a current transmission capacity (conductivity/resistance) which is alterable by means of a first actuating signal, wherein an operating state of the first electrical actuating element is characterized by a first electrical variable and a second electrical variable, the first electrical variable being a voltage drop across the first electrical actuating element and the second electrical variable being the first actuating signal, a first voltage-measuring device connected directly to the two terminals of the first electrical actuating element and being configured to measure the voltage drop across the two terminals of the first electrical actuating element, and an open-loop control device that activates the first electrical actuating element and evaluates values of the electrical variables thereby obtained for purposes of detecting a malfunction of the first electrical actuating element, wherein one of the two electrical variables is held at a prescribed value, and regulating the voltage drop across the first electrical actuating element at the prescribed value.

13. The method as claimed in claim 12, wherein, values of respective other variables are compared directly, or wherein standard signals are generated by an application of correction values, which are correlated with one another, or with prescribed values, by the open-loop control device.

14. The method of claim 12, wherein said regulating the voltage drop comprises regulating the voltage drop at the prescribed value by modifying the second electrical variable.

15. A device for purposes of monitoring the disconnectability of an electrical load, which is connected to a power supply with a first and a second current path, the device comprising:
- a first electrical actuating element that is provided in the first or second current path, the first electrical actuating element being a field effect transistor having a source terminal and a drain terminal, the first electrical actuating element having a current transmission capacity (conductivity/resistance) which is alterable by means of a first actuating signal, wherein an operating state of the first electrical actuating element is characterized by a first electrical variable and a second electrical variable, the first electrical variable being a voltage drop across the first electrical actuating element and the second electrical variable being the first actuating signal,
- a first voltage-measuring device connected directly to the source and drain terminals of the field effect transistor and being configured to measure the voltage drop between the source and drain terminals of the field effect transistor, and
- an open-loop control device, which is configured so as to activate the first electrical actuating element, at least at measuring intervals spaced apart from one another in time, and so as to evaluate values of the electrical variables thereby obtained for purposes of detecting a malfunction of the first electrical actuating element, and
- a first closed-loop control device configured to regulate the voltage drop across the first electrical actuating element at a prescribed value by altering the second electrical variable, wherein the second electrical variable is a gate source voltage of the field effect transistor.

* * * * *